United States Patent [19]
Khan

[11] Patent Number: 4,899,308
[45] Date of Patent: Feb. 6, 1990

[54] HIGH DENSITY ROM IN A CMOS GATE ARRAY

[75] Inventor: Emdadur R. Khan, San Jose, Calif.

[73] Assignee: Fairchild Semiconductor Corporation, Santa Clara, Calif.

[21] Appl. No.: 940,363

[22] Filed: Dec. 11, 1986

[51] Int. Cl.$^4$ .................. G11C 11/40; H03K 19/094
[52] U.S. Cl. .................................. 365/104; 365/181; 365/189.09; 365/189.11; 307/469; 340/825.91
[58] Field of Search ............ 365/94, 103, 104, 181, 365/210, 226; 307/465, 468, 469; 340/825.79, 825.83, 825.85, 825.86, 825.87, 825.89, 825.90, 825.91; 357/45; 364/716

[56] References Cited

U.S. PATENT DOCUMENTS

| | | | |
|---|---|---|---|
| 4,093,942 | 6/1978 | Suzuki et al. | 365/104 |
| 4,274,147 | 6/1981 | Padgett et al. | 365/104 |
| 4,659,948 | 4/1987 | Sunter et al. | 307/469 |
| 4,740,721 | 4/1988 | Chung et al. | 340/825.83 |
| 4,771,284 | 9/1988 | Masleid et al. | |
| 4,779,010 | 10/1988 | Moss | 307/469 |

FOREIGN PATENT DOCUMENTS

| | | | |
|---|---|---|---|
| 0212899 | 10/1985 | Japan | 365/104 |
| 0168198 | 7/1986 | Japan | 365/104 |

Primary Examiner—Glenn A. Gossage
Attorney, Agent, or Firm—Burns, Doane, Swecker & Mathis

[57] ABSTRACT

A memory circuit implemented in a CMOS gate array employs both P-channel and N-channel transistors as memory devices. The use of P-channel memory devices is made possible by providing a level-shifting circuit and a voltage reference circuit to compensate for manufacturing process variations and fluctuations in power supply levels. The reference circuit is made up of a series connection of P-channel FETS that are the same as the memory transistors. The reference voltage produced by the reference circuit tracks variations in the power supply and reflects changes in manufacturing processes so that they are compensated in the output of the level shifting circuit. Performance is further enhanced by clocking load FETS that connect the memory transistors to the voltage source, and density is increased by providing two word lines per row of memory transistors.

13 Claims, 7 Drawing Sheets

HIGH DENSITY ROM IN A CMOS GATE ARRAY

BACKGROUND OF THE INVENTION

The present invention relates to the field of semiconductor memories and is particularly related to the application of CMOS gate array circuits as read-only memories (ROMs).

A gate array or uncommitted logic array is a matrix of transistors that is defined on an integrated circuit (IC) chip up to the final stage of chip processing. The final manufacturing step usually involves patterning one or more metal layers to connect the transistors in the matrix together to realize a desired set of logic functions or gates. The gates can be interconnected to realize an desired chip function and the interconnecting wiring traces are often arranged in parallel lines between the rows of transistors.

Complementary metal oxide semiconductor (CMOS) gate arrays absorb appreciable power only when the CMOS gates switch logic states, and thus have lower average power consumption per gate than arrays employing other technologies such as bipolar. This feature is particularly important in very-large-scale-integration (VLSI) ICs which can have in excess of a million transistors on a single chip. Each CMOS gate is composed of a number of P-channel and N-channel field-effect transistors (FETS) which are interconnected appropriately; for example, typical two-input NOR and NAND gates are each composed of two P-channel and two N-channel FETs.

In employing a gate array as a memory circuit, for example a ROM, the individual transistors are directly connected in a matrix which is programmed during IC manufacturing to store bits of information in the form of the presence or absence of a transistor at each matrix intersection. Such a matrix, and the connection of the memory transistor elements between word-lines and bit-lines, is shown generally in FIG. 1. The figure shows that all of the transistors in the array are present. In actual practice, only selected ones of the memory transistors will be connected to a word line in accordance with the particular pattern of binary ones and zeroes to be stored in the memory.

Consistent with the complementary nature of CMOS, equal numbers of P-channel and N-channel transistors are formed in the matrix of a CMOS gate array. In the past, when a ROM has been realized in such a gate array, only about half of the transistors on the chip are utilized because ROMs have typically been composed of N-channel transistors only, as depicted in FIG. 1. P-channel FETs have not been used as memory elements because they have slower switching speeds than N-channel FETs of the same size. Also of particular importance in a memory device, sensing of the presence of N-channel FETs has been more reliable because they have a higher mobility (i.e. lower resistance) than P-channel devices. In addition they are complementary to the usually P-channel load FETs and level-sensing components, and thus develop an easily identified voltage difference between the logic 0 (transistor present) and logic 1 (transistor absent) states.

When P-channel transistors are used as the memory elements unavoidable IC manufacturing process variations, as well as changes in the supply voltage, can result in small, and thus difficult to detect, differences in bit-line voltage levels between the logic zero and logic one state. For example, for a typical positive power supply voltage ($V_{cc}$) of 4.5 volts, the voltage difference between logic high and low states might be less than 1 volt, in contrast to the difference of at least $V_{cc}/2$ (2.25 volts) and typically more for higher mobility N-channel memory transistors.

Another limitation associated with CMOS memory circuits that employ only the N-channel transistors as storage devices is their longer interconnection length. In particular, even though P-channel transistors are not used as memory elements they are still present within the IC structure. Typically, an unused P-channel transistor is located between each two N-channel memory elements. To avoid this arrangement, as well as to easily implement bit line sense amplifiers, the ROM can be custom designed and located in the periphery of the chip, with the logic gates being located in the center of the chip. This approach is not entirely desirable, because it loses the design flexibility that is afforded by gate array structures. Further, the relatively long interconnects that are required between the logic portion of the chip and the memory elements can introduce delays and routing problems.

OBJECTS AND BRIEF SUMMARY OF THE INVENTION

Accordingly, it is an object of the present invention to allow the efficient use of CMOS gate arrays as ROMs by using both P-channel and N-channel FETs as memory elements.

It is a further object of the present invention to compensate and avoid the effects of IC manufacturing process and supply voltage variations in the efficient use of a CMOS gate array as ROM.

It is a further object of the present invention to provide a memory device having a chip size optimized for interconnection routability, speed and power consumption.

It is a further object of the present invention to have all circuitry necessary to the basic operation of a ROM realized in a single gate array chip using the basic gate-array transistor.

It is a further object of the present invention to improve the speed and electrical performance of a CMOS ROM by increasing the effective density of the memory devices on the chip.

It is yet another object of the invention to implement a highly dense, programmable and reconfigurable ROM that can be located anywhere on a chip, and thereby ease VLSI system design.

These and other objects are achieved in accordance with the present invention by providing a level-shifting circuit and a voltage reference circuit to respond to and compensate for the effects of IC manufacturing process variations and changes in the IC power supply voltage level. The reference circuit comprises a series-connection of a number of P-channel FETs; the number is selected to have the reference circuit produce a voltage level substantially halfway between the maximum logic one and the maximum logic zero bit-line voltage levels of a memory cell.

In a particular embodiment of the present invention, an additional group of word-lines is provided for connection to previously unused FETs which are positioned throughout the memory matrix to isolate the memory elements from one another. These FETs share the same bit-lines as the first group of memory FETs. Isolation is still provided because only one word-line is active at any one time, so all of the memory FETs connected to the inactive word-lines remain OFF. The area of the gate array chip is thus used more efficiently and the density of storage elements on the chip is increased.

Additional features and advantages of the present invention will become apparent to those skilled in the art from the following detailed description of preferred embodiments illustrated in the accompanying drawings.

DETAILED DESCRIPTION

Figure 1:
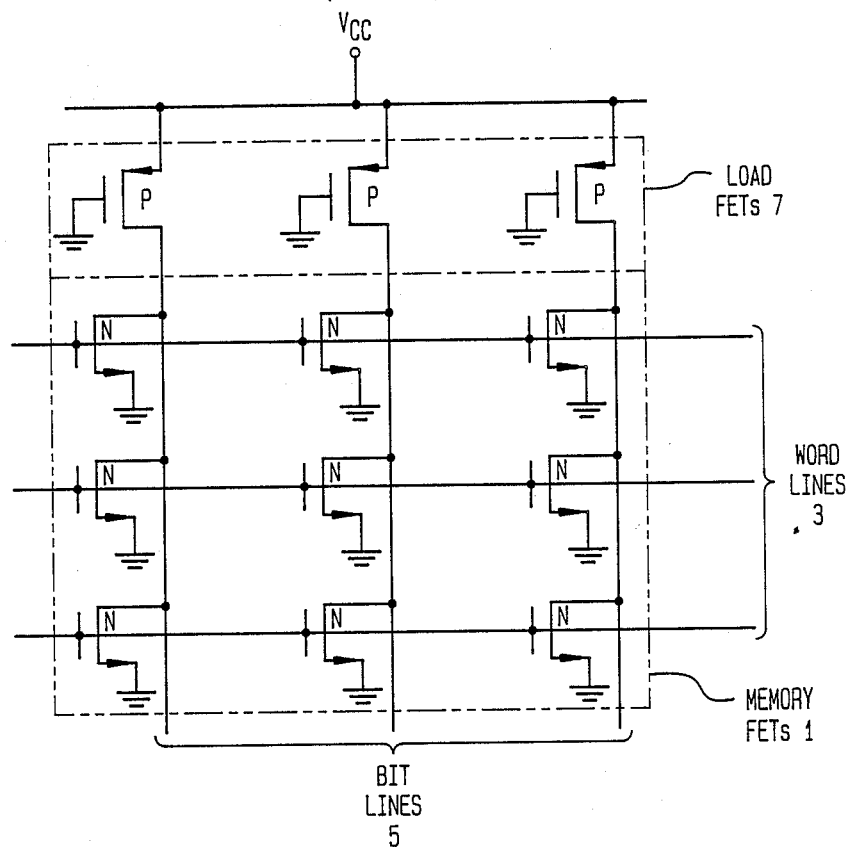
FIG. 1 is a schematic circuit diagram of a FET memory matrix representative of the prior art.

As shown in FIG. 1, the usual realization of a ROM in CMOS components has a regular matrix of N-channel FETs 1 which are connected to horizontally disposed word-lines 3 and vertically oriented bit-lines 5. The drains of the individual memory elements in each column of the matrix 1 are connected to one of the bit-lines 5 while the gates of the memory FETs in each row of the matrix 1 are connected to one of the word-lines 3. Also connected to each bit-line is a load comprised of a P-channel FET 7 which has the characteristics of a nonlinear resistance limiting the amount of current flowing through the memory FETs when they are gated ON. Use of a transistor as a load resistor is well-known in the art and allows fabrication of memory circuits which consist solely of FETs and no other components such as diodes, resistors or capacitors. Not shown in FIG. 1 are isolation transistors located between the memory elements in the rows and columns of the matrix which provide electrical isolation between the memory FETs.

In the idle state, the voltage levels of the bit-lines 5 are high, i.e., near the supply voltage level, $V_{cc}$, because all of the memory elements 1 are OFF, i.e. the word lines are low. The memory is read by imposing a positive voltage on a selected word-line 3. If a memory transistor has its ate attached to the now-positive word-line, that transistor is gated ON and the voltage level on the attached bit-line decreases. This voltage swing is sensed by other components, not shown in FIG. 1, and the information stored in the device is thus transmitted to the utilization circuitry.

When a CMOS gate array having equal numbers of P-channel and N-channel transistors is used for the ROM shown in FIG. 1, almost three-quarters of the available transistors on the chip are unused. More particularly, P-channel FETs have not been used as memory elements in the past because sensing the bit-line voltages is easier and more reliable with N-channel FET memory elements. This situation arises because the higher inherent resistance of a P-channel memory FET produces a smaller bit-line voltage swing than that produced by an N-channel memory FET. This result occurs because the load FETs are typically operated in the linear region whereas the memory FETs 1 are in saturation. A P-channel transistor operating in the linear region presents a smaller resistance than one which is saturated. Thus, the memory element will have a higher resistance, raising the voltage on the bit line above the value of $V_{cc}/2$.

In addition, one-half of the N-channel transistors are typically used for isolation purposes rather than as memory elements.

Figure 2:
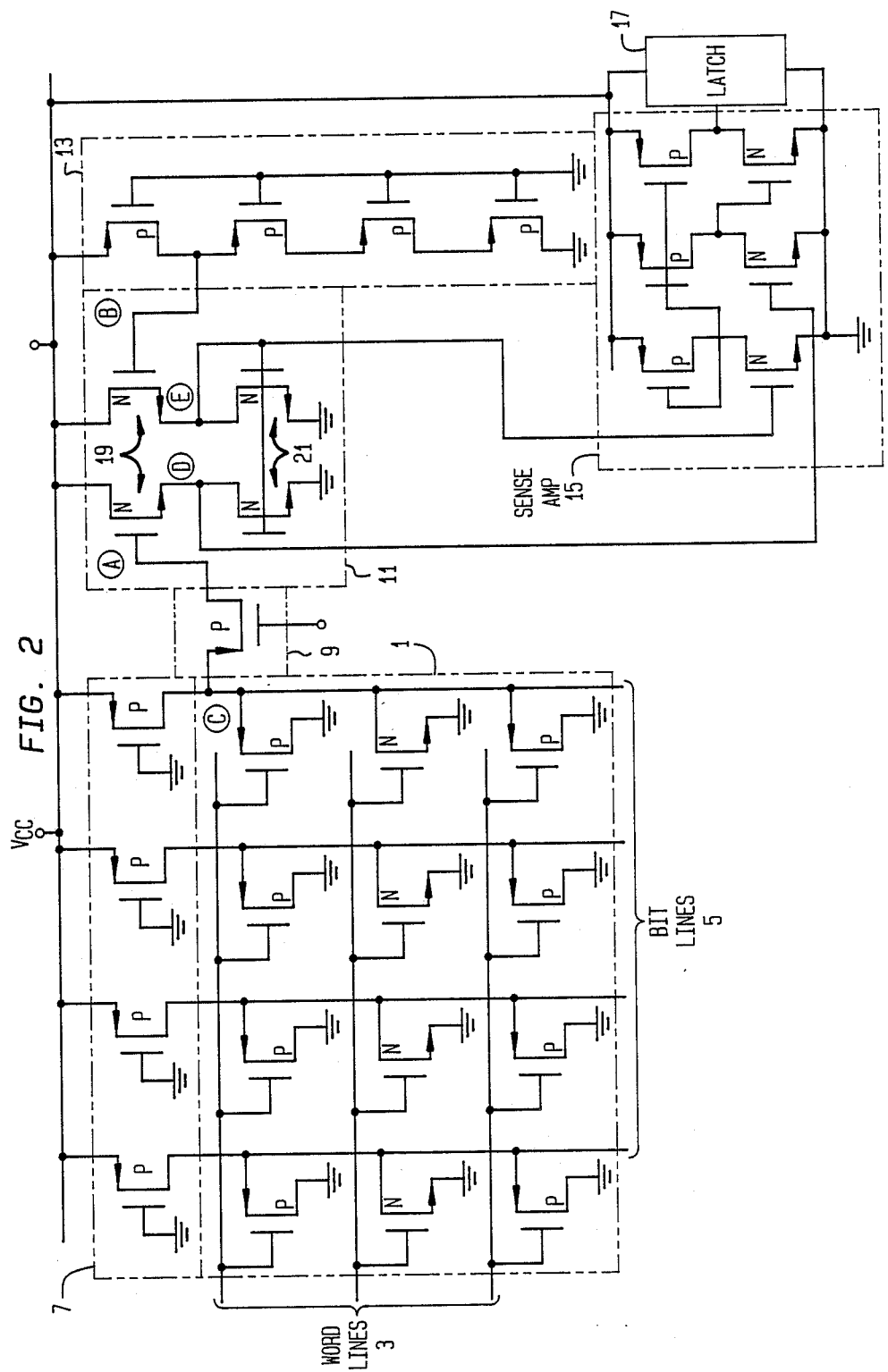
FIG. 2 is a schematic circuit diagram of a FET memory matrix and sensing circuitry in accordance with the present invention.

FIG. 2 shows a memory device according to the present invention in which alternating rows of P-channel and N-channel FETs are each used as memory elements. The load transistors 7 are all biased ON thereby raising the voltage level of the bit-lines 5 to substantially the positive supply voltage level. In this embodiment the word-lines 3 connected to the P-channel memory FETs are normally high (near the power supply voltage) while the word-lines 3 connected to the N-channel memory FETs are normally low (near ground). In this way all of the memory FETs are gated OFF. The memory is read by imposing a positive voltage on an N-channel word-line or a low voltage on a P-channel word-line through suitable selection circuitry (not shown).

The use of both P-channel and N-channel FETs as shown in FIG. 2 results in a significant improvement in the efficient utilization of a gate array since it doubles the number of array components that are used as memory devices.

In accordance with the present invention, the use of P-channel FETs as memory devices is made possible by providing an appropriate reference voltage against which the bit-line voltage is compared to determine whether it represents a logic 0 or a logic 1. FIG. 2 illustrates one example of a sense circuit for determining the state of one of the bit-lines 5. This sense includes a read-enable switch 9, a level-shifter 11, a voltage reference 13, a sense amplifier 15 and a latch 17. All of these other components are advantageously realized on the gate-array chip itself using the basic gate-array transistors. Although only one sense circuit is shown in FIG. 2, it will be appreciated that a similar circuit would be provided for each bit line. Alternatively, a single sense circuit could be shared by several bit lines through an appropriate multiplexing arrangement.

The level-shifter II comprises a single-stage differential amplifier, formed by two N-channel FETs 19, and a current mirror active load formed by two other N-channel FETs 21. One input A to the differential amplifier is equal to the bit-line voltage C when the read-enable switch 9 is on, while the other input is a reference level B provided by the voltage reference circuit 13. As discussed in more detail below, the reference voltage level B is preferably set at about the midpoint between the bit-line's minimum and maximum voltage levels for P-channel storage devices. The output of the level shifter 11, i.e., the voltage difference between nodes D and E in the figure, will be positive or negative (relative to a predetermined threshold) in accordance with a high bit-line voltage or a low bit-line voltage, respectively.

In operation, the level shifting circuit functions to shift the bit line voltage swing between the logic 0 and 1 states to a level which is further away from the value of $V_{cc}$, to facilitate better amplification in the sense amplifier 15. For example, if the value of $V_{cc}$ is 4.5 volts, the bit line voltage for a logic one will be 4.5 volts and a logic zero may be 3.5 volts. In this case the median value which forms a threshold for determining the logic state, i.e. 4 volts, is very close to $V_{cc}$. However, the level shifting circuit 11 provides a D.C. shift to the voltage values that are fed to the sense amplifier so that the threshold is not so near $V_{cc}$. Preferably, the threshold value is chosen to be around $V_{cc}/2$, e.g. 2.5 volts. In this case, the level shifting circuit 11 produces an output signal of 3.0 volts for a logic one and a signal of 2.0 volts for a logic zero.

The output of the level-shifter 11 is connected to the sense amplifier 15 which comprises first stage having another differential amplifier with a current mirror active load and a second stage inverter with the same current mirror load. The sense amplifier 15 has a large voltage gain and effectively functions as a comparator with two stable output voltage levels zero and the power supply level. The high gain of the sense amplifier 15 permits reliable sensing of bit-line voltage swings as small as 50 mV. The output of the sense amplifier 15 is held by the latch circuit 17 which is of any suitable design known in the art. The latch holds the last sense amplifier output despite changes in the bit-line voltage level.

The use of current mirrors in the sense amplifier 15 and level-shifter 11 provides high impedance loads for the differential amplifiers as well as significant immunity from the effects of power supply voltage variations, thus allowing the memory device of the present invention to operate in the presence of supply voltage fluctuations.

The reference voltage circuit 13 compensates and eliminates the effects Which power supply swings and manufacturing process variations may have on the characteristics of the P-channel FETs. If the power supply voltage should fluctuate, the reference voltage and the bit line voltage will track one another, and thus the detection of the output state will not be affected.

The reference circuit 13 is a series-connection of only P-channel FETs, which correspond to the P-channel load and memory FETs in the matrix circuit. These transistors are formed with the same dimensions of the load and memory FETs. Consequently, manufacturing process variations will be reflected in both the memory storage transistors and in the reference circuit transistors, resulting in no relative change in the input levels to the amplifier 11. Preferably, for large ROMs the reference circuit 13 is physically located at about the center of the ROM to best reflect process changes that may occur from the top to the bottom of the ROM.

The reference voltage that the circuit 13 provides as an input to the level shifting circuit 11 is preferably located at about the middle of the voltage swing that occurs on a bit line during a change from one state to the other. The number of FETs connected in series to produce this level is determined by taking the difference between the expected maximum logic one and maximum (worst case) logic zero bit-line voltages, dividing this difference by 2 and subtracting it from $V_{cc}$. When this value is determined, the proper number of series-connected FETs necessary to form a voltage divider which produces such a voltage can be readily selected. An added feature of the reference circuit 13 is that the series connection reduces the drain current and hence the power dissipation to an advantageously low level.

Figure 3:
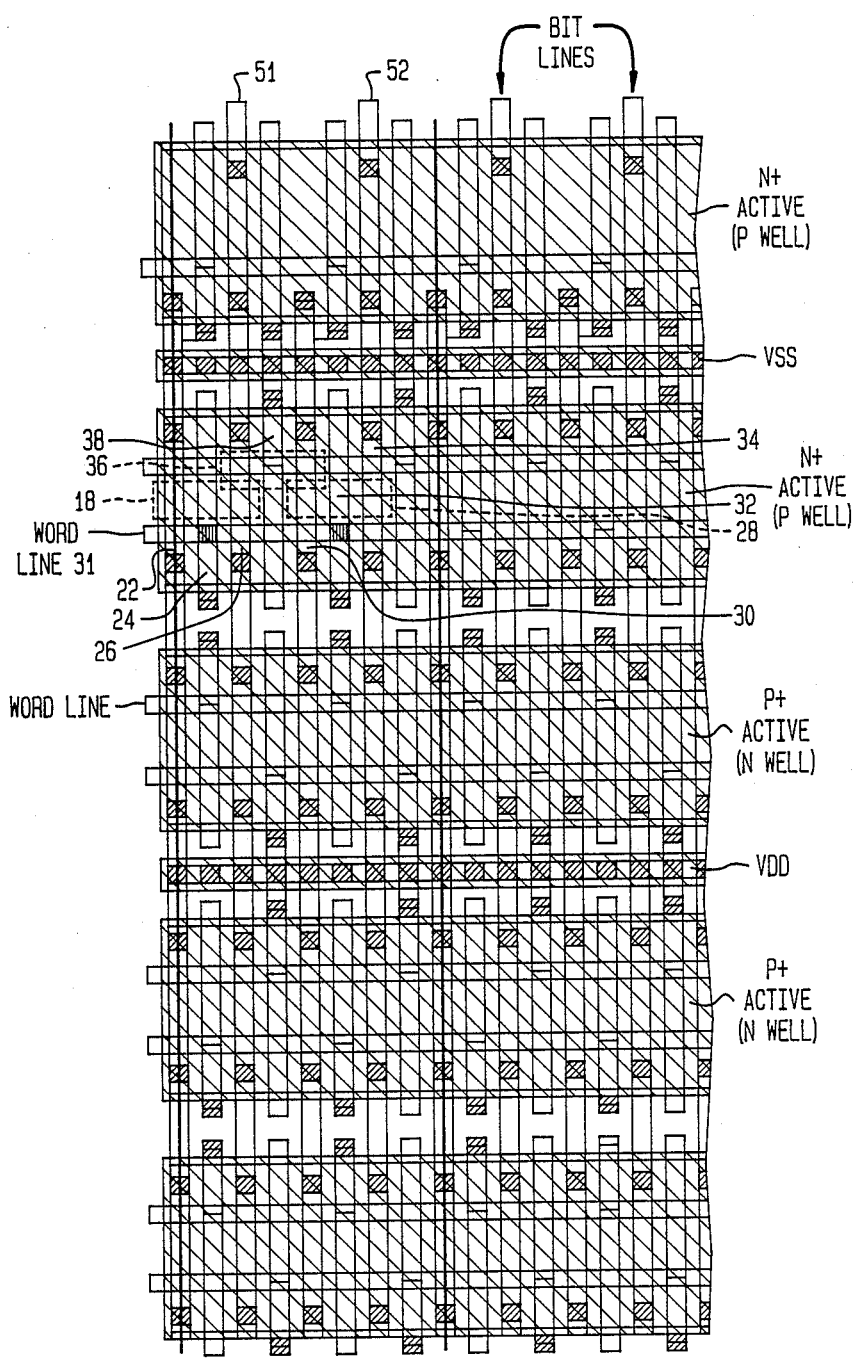
FIG. 3 is a composite overview of a portion of the physical gate array chip layout in accordance with the present invention.

The improved memory device described in regard to FIG. 2 can be realized in a sea-of-gates structure as shown in FIG. 3. Also, gate arrays organized according to any of the several approaches ranging from block cells to butting cells or sea-of-gates can be used to implement the memory device of the present invention.

Referring to FIG. 3, one N-channel memory transistor 18 is formed in an N+ active (P-well) region 20 with an N type source 22, a gate region 24 and an N type drain 26. The drain of the transistor is connected to a bit line 51 by means of a suitable contact. A second memory transistor 28 is similarly formed by an n-type source 30, a gate region 32 and an n-type drain 34 that is connected to a bit line 52. The gate regions 24 and 32 are selectively connected to a word line 31 in accordance with the data to be stored in the ROM.

It can be seen that a third transistor 36 exists between the two transistors 18 and 28, and overlaps them. This third transistor is formed by the drain 26, the source 30 and a gate region 38. If a charge is induced on this gate region, the transistor could turn on and thereby short the bit line 51 to $V_{ss}$. To prevent such an occurrence, the gate region 38, and every other gate region, is connected to ground (e.g., $V_{ss}$ for N-channel transistors). Thus each transistor which includes one of these grounded gates is held in a non-conductive state.

Similar types of connections can be made for P-channel transistors.

Figure 4:
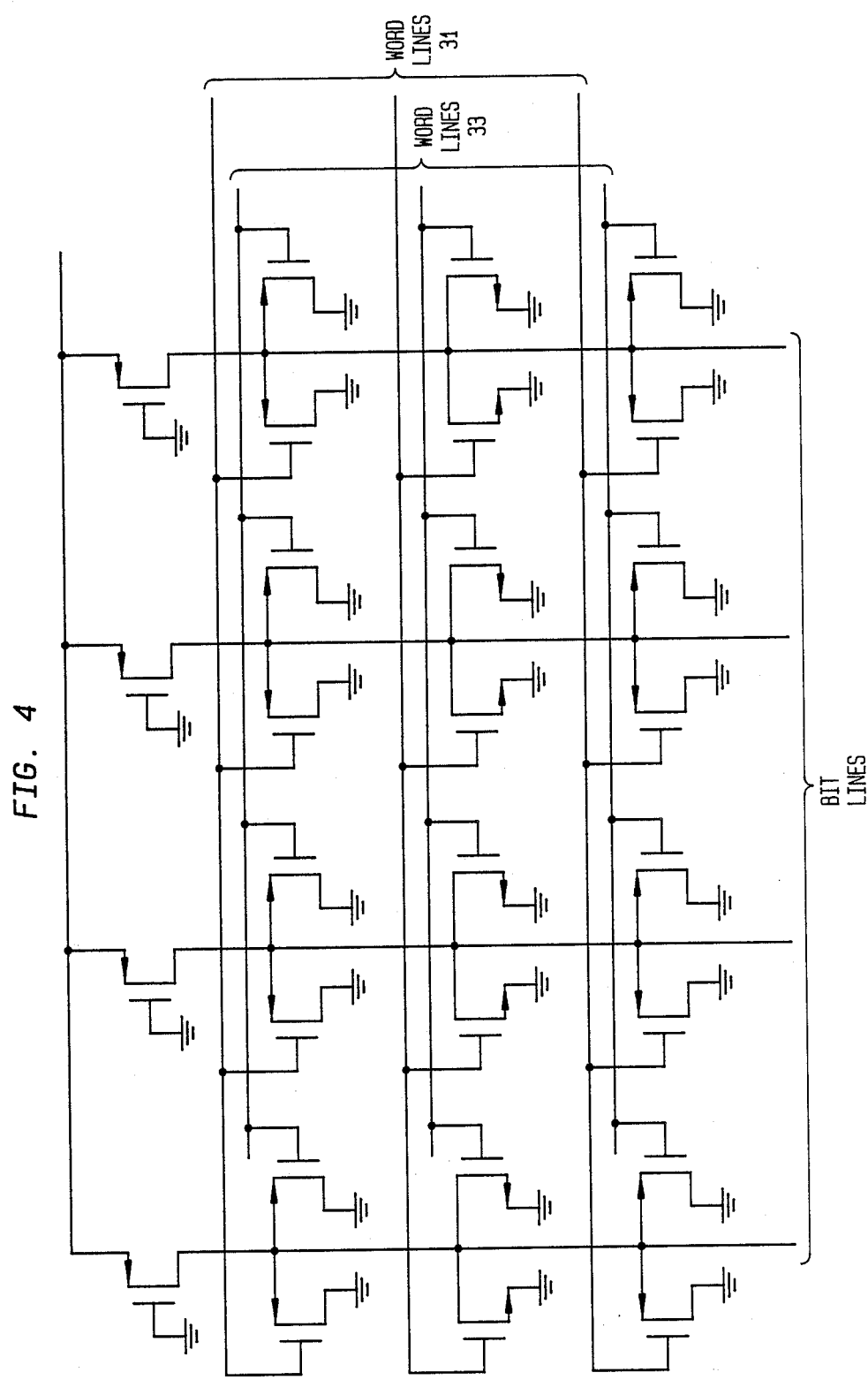
FIG. 4 is a schematic circuit diagram of a further embodiment of a FET memory matrix in accordance with the present invention.

An alternative embodiment of the present invention which has the additional advantage of using for memory nearly all the transistors present in a CMOS gate array as memory elements is shown in FIG. 4. An additional set of word-lines 33 is provided for addressing the isolation transistors such as transistor 36 in the embodiment shown in FIG. 3. Word-lines 31 correspond to word-lines 3 in FIG. 2. Only one word-line, either 31 or 33, is activated at any one time to address every other FET in a row. The inactive FETs connected to the other word line serve as isolation transistors for the addressed FETs. In this embodiment the FETs connected to both sets of word-lines share the same set of bit-lines thereby reducing fabrication complexity and eliminating extra level shifters, voltage references, sensing amplifiers and latch circuits. The operation of the circuitry shown in FIG. 4 proceeds in a manner similar to that already described in regard to FIG. 2.

Figure 5:
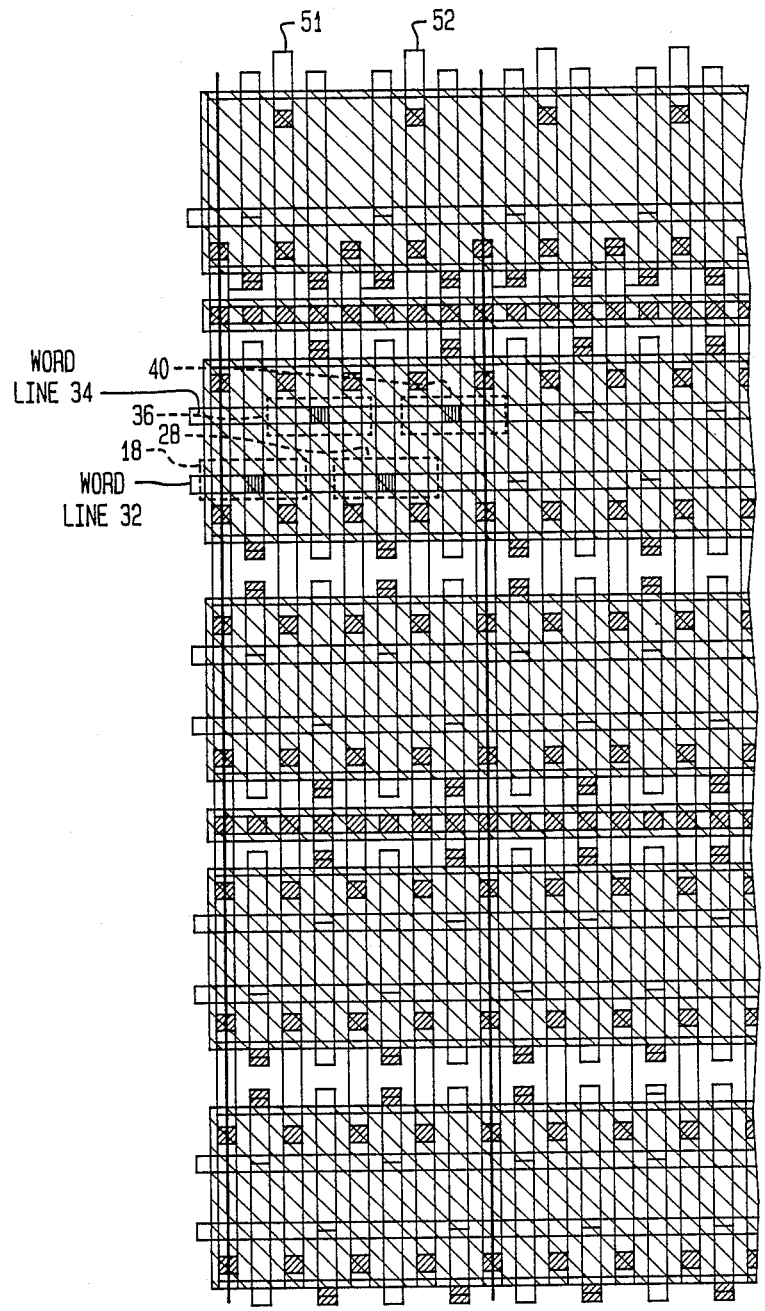
FIG. 5 is a composite overview of a portion of the physical gate array chip layout of a further embodiment in accordance with the present invention.

The embodiment of the present invention shown in FIG. 4 can be realized in a sea-of-gates CMOS structure as shown in FIG. 5. The transistors 18 and 28 in one row of the ROM have their gates connected to one word line 32, whereas the alternate transistors 36 and 40 in the same row of the ROM have their gates connected to the word line 34 (assuming each stored bit is to be a logic 0). The transistors 18 and 36 share the bit line 51, and the transistors 28 and 40 share the bit line 52. In operation, when it is desired to read the information stored in the row containing the word lines 32 and 34, the voltage of one word line, e.g. 32, is pulled high while the other is held low. The transistors connected to the low word line remain off to inherently isolate the bit lines from one another. After the information associated with the word line 32 has been retrieved, the voltages of the two lines 32 and 34 can be switched to read the other half of the data stored in that row of the memory.

Thus, it will be appreciated hat the shared bit line approach of FIGS. 4 and 5 effectively makes us of all available transistors in a sea-of-gates arrangement and doubles the storage capacity per unit area of the chip. The presence of the extra word line per row of the memory does not represent a limitation, since a typical sea-of-gates structure offers plenty of room in which to place the second line.

Figure 6:
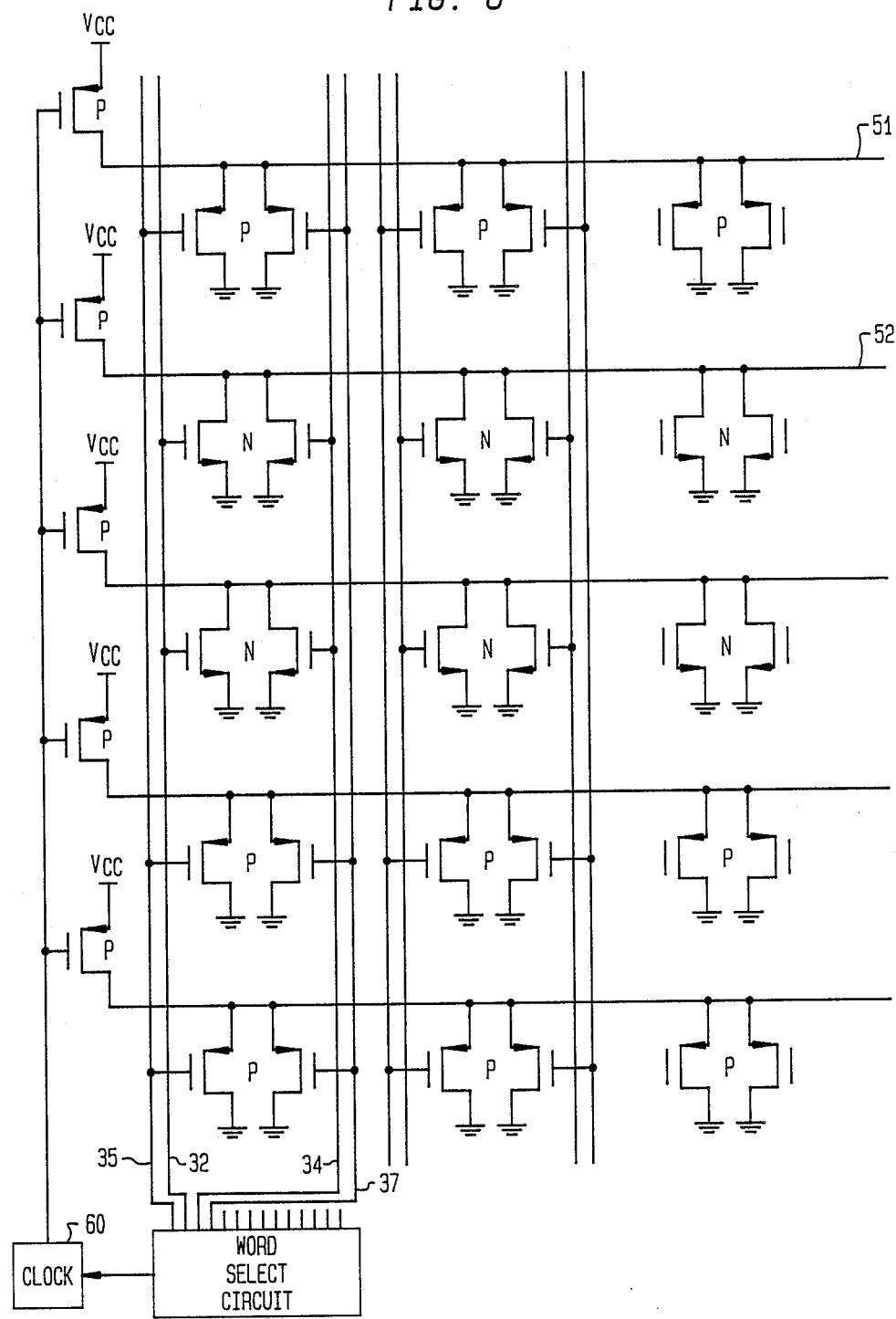
FIG. 6 is a schematic circuit diagram of a third embodiment of the invention.
Figure 7:
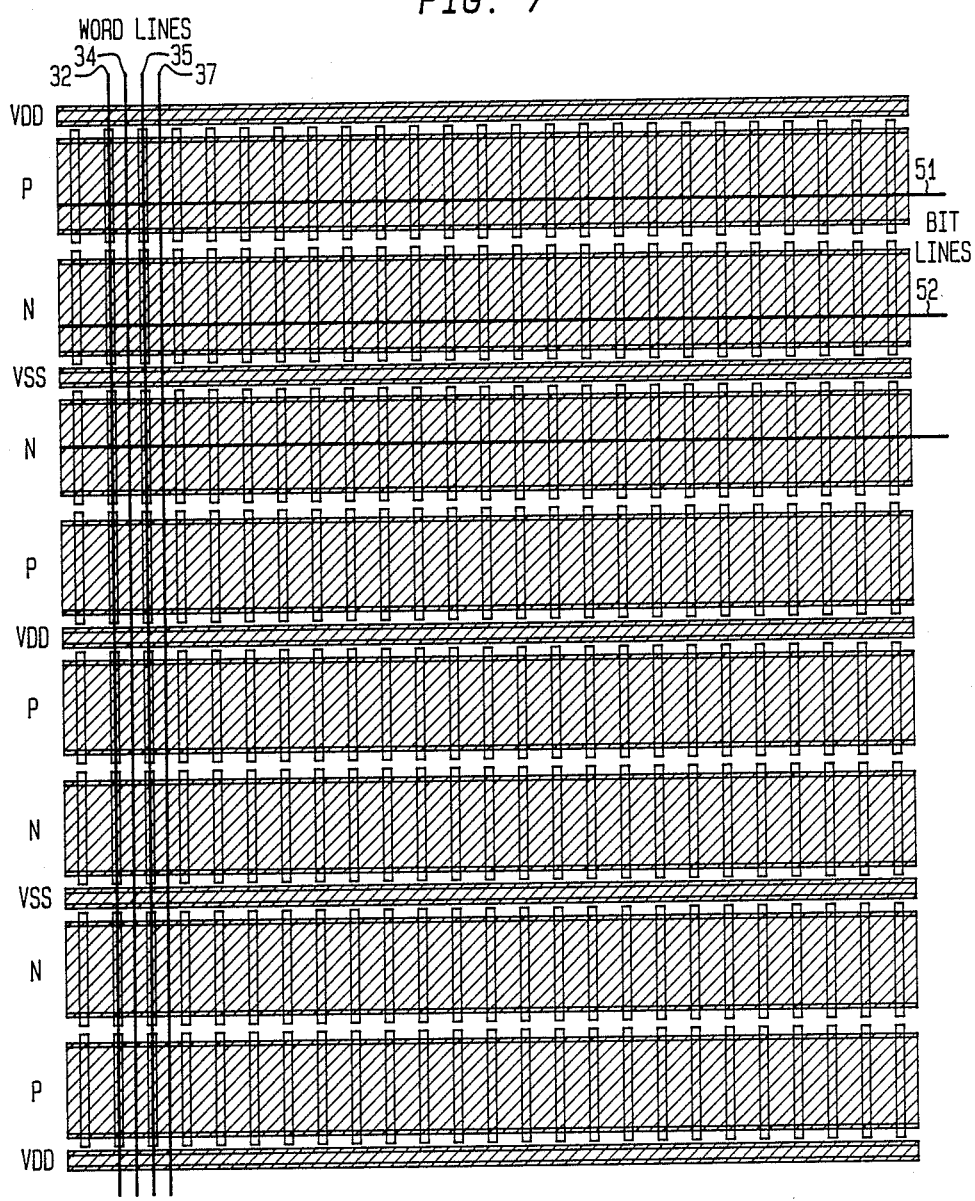
FIG. 7 is a composite overview of a portion of the memory layout for a chip incorporating the third embodiment of FIG. 6.

It will be appreciated by those of ordinary skill in the art that the present invention can be embodied in other specific forms without departing from its spirit or essential characteristics. For example, the shared bit approach can be implemented in a different layout as shown in FIGS. 6 and 7. In this arrangement, the bit lines 51, 52, etc. are oriented horizontally and the word lines 32, 34, 35 and 37 are vertically disposed. There are four word lines per column of the matrix, assuming each column comprises the two transistors which share a bit line. Two word lines, 32 and 34, are associated with the N-channel transistors and respectively address the two paired transistors in a cell. The other two word lines, 35 and 37, are connected to the P-channel transistors and similarly address the two transistors of a cell in an alternating fashion.

This type of arrangement is advantageous in that it increases the flexibility for ROM placement and orientation in the gate array. In addition, the shared bit architectures facilitate the implementation of PLA (programmable logic array) and PAL (programmable array logic) circuits in a CMOS gate array.

Another variation of the invention is also shown in the embodiment of FIG. 6. In the embodiment of FIG. 2, the gate of each load FET 7 is connected to ground, e.g. $V_{ss}$, to maintain the transistor in a conductive state. However, it is possible to selectively actuate the load FETs by connecting their gates to a clock source 60, as shown in FIG. 6. In operation, the gates of the FETs 7 are normally held low to turn them on and charge the bit lines up to a level equal to $V_{cc}$. When a word line is activated to read the memory, the signal from the clock source is increased in voltage to turn off the load FETs. Under this condition, if any P-channel memory transistor 1 is turned on by the actuated word line it will discharge its associated bit line and pull its voltage to ground, thereby providing a better voltage level for sensing a stored zero bit.

As an alternative to turning the load FETs off with the clock signal it is possible to increase their gate voltage to a level higher than $V_{ss}$ so that they present a higher resistance, and thus a greater voltage drop on the bit line, when a zero bit is being sensed through a P-channel memory element.

Furthermore, although described with regard to their implementation in a ROM, the inventive concepts are applicable to random access memories (RAMs) as well.

The presently disclosed embodiments are therefore considered in all respects to be illustrative and not restrictive. The scope of the invention is indicated by the appended claims, rather than the foregoing description, and all changes that come within their meaning and range of equivalents are intended to be embraced by them.

What is claimed is:

1. A memory device for storing information, comprising:
   a matrix of CMOS FETs for storing information, wherein each FET has a drain, a gate and a source, the gates of the FETs in each row of the matrix are connected to one of a plurality of word-lines, the drains of N-channel FETs in each column of the matrix are connected to one of a plurality of bit-lines, the sources of P-channel FETs in each column of the matrix are also connected to one of the plurality of bit-lines, and the stored information is read by sensing voltage levels on the bit-lines;
   a plurality of load transistors which connect respective bit lines of said memory device to a power supply voltage source;
   a level-shifting circuit having a first input which is coupled to one of the plurality of bit-lines to produce an output that is indicative of the voltage level on that bit line and is shifted in a direction away from the voltage of said voltage source;
   a reference voltage circuit for providing a reference level for a bit-line voltage which compensates for power supply fluctuations and variations in manufacture of the device, said reference voltage circuit comprising a series-connection of a predetermined number of FETs and having an output connected to a second input of said level-shifting circuit;
   a sense amplifier connected to the output of said level shifting circuit for detecting the bit-line voltage levels; and
   a latch circuit for holding an output voltage from the sense amplifier.

2. The memory device of claim 1 wherein the series connected reference circuit FETs are all P-channel transistors.

3. The memory device of claim 1 wherein the FETs for storing information are both P-channel type and N-channel type arranged in a gate-array.

4. The memory device of claim 1 wherein the predetermined number of FETs in said reference voltage circuit provides a reference voltage level substantially equal to the power supply voltage minus one-half of the difference between the maximum and minimum bit-line voltage levels.

5. An MOS memory circuit comprising:
   a matrix arrangement of memory transistors, said memory transistors comprising P-channel MOS transistors, each having its drain electrode connected to a first voltage source, its source electrode connected to a bit line, and its gate electrode connected to a word line;
   a plurality of load transistors each of which connects a respective bit line of said memory circuit to a second voltage source, each of said load transistors comprising a P-channel MOS transistor;
   a reference voltage circuit comprised of a series connection of a plurality of P-channel MOS transistors which produce a reference voltage which is between minimum and maximum voltages produced on a bit line by actuation of said memory transistors; and
   means for comparing the voltage on a selected bit line with said reference voltage and producing an output voltage that has one of two values in dependence upon the value of the voltage on said selected bit line relative to said reference voltage, the two output voltage values having a median value which is farther from the voltage of said second voltage source than said reference voltage.

6. The memory circuit of claim 5 wherein all of the P-channel MOS transistors which comprise said memory transistors, said load transistors and the series-connected transistors of said reference voltage circuit formed with the same dimensions so that they have substantially similar properties and thus reduce adverse effects associated with manufacturing process and voltage supply variations.

7. The memory circuit of claim 5 further including means for reducing the conductivity of said load transistors during a time that a voltage on a word line is varied to actuate the memory transistors whose gates are connected thereto.

8. The memory circuit of claim 5 wherein said means for comparing includes a differential amplifier which receives the voltage on said selected bit line as one input signal and said reference voltage as another input signal.

9. The memory circuit of claim 8 wherein said differential amplifier comprises N-channel transistors.

10. The memory circuit of claim 5 wherein said load transistors have a predetermined bias voltage applied to their gate electrodes and said series connected transistors of said reference voltage circuit have said bias voltage applied to their gate electrodes.

11. The memory circuit of claim 10 wherein said bias voltage is equal to the voltage of said first voltage source.

12. A memory circuit, comprising:
a multiplicity of MOS transistors arranged on a chip in a plurality of rows and a plurality of columns, all of the transistors in a row being of the same conductivity type;
a plurality of word lines associated with the rows of transistors, there being two word lines per row of transistors, the two word lines for a particular row being selectively connected to the gates of the transistors in that row in an alternating fashion; and
a plurality of bit lines associated with the columns of transistors, each bit line being connected to a respective pair of transistors in each row, the gates of each respective pair of transistors being connected to the two word lines associated with the row in which they are located.

13. The memory circuit of claim 12 wherein a first plurality of said rows of transistors comprise P-channel transistors and a second plurality of said rows of transistors comprise N-channel transistors.

* * * * *